(12) United States Patent
Chi et al.

(10) Patent No.: US 8,617,996 B1
(45) Date of Patent: Dec. 31, 2013

(54) FIN REMOVAL METHOD

(71) Applicant: GLOBALFOUNDRIES Inc., Grand Cayman (KY)

(72) Inventors: Min-hwa Chi, Malta, NY (US); Honglian Shen, Malta, NY (US); Changyong Xiao, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/738,435

(22) Filed: Jan. 10, 2013

(51) Int. Cl.
*H01L 21/311* (2006.01)

(52) U.S. Cl.
USPC .................... 438/700; 438/587; 257/E21.377

(58) Field of Classification Search
USPC .......... 257/E21.014, E21.37, E21.377, E21.4
See application file for complete search history.

(56) References Cited

U.S. PATENT DOCUMENTS 6,872,647 B1 * 3/2005 Yu et al. ........................ 438/585

* cited by examiner

*Primary Examiner* — Cheung Lee
(74) *Attorney, Agent, or Firm* — Maxine L. Barasch; Keohane & D'Alessandro, PLLC

(57) ABSTRACT

Methods for removal of fins from a semiconductor structure are provided. A fin liner is applied to the fins. The fin liner is then removed from the fins that are to be removed. The fin liner is of a material that is selective compared to the semiconductor fins. Hence, the fins can be removed without significant damage to the fin liner. The subsets of fins that are to be removed are then removed, while the fin liner protects the adjacent fins that are to be kept.

20 Claims, 15 Drawing Sheets

FIN REMOVAL METHOD

FIELD OF THE INVENTION

The present invention relates generally to semiconductor fabrication and, more particularly, to methods of removing semiconductor fins.

BACKGROUND

With the continuing trend towards miniaturization of integrated circuits (ICs), there is a need for transistors to have higher drive currents with increasingly smaller dimensions. Fin field effect transistor (finFET) technology is becoming more prevalent as device size continues to shrink. During the fabrication process of fin devices such as finFETs, it is often necessary to remove some fins to provide isolation areas. It is therefore desirable to have improved fin removal methods to provide improved product yield and performance.

SUMMARY

In general, embodiments of the invention provide improved methods for removal of fins. During fabrication of integrated circuits, semiconductor fins may be formed in a uniform pattern. In some cases, multiple fins may be merged together, usually with an epitaxially grown semiconductor, to provide greater drive current capability for certain transistors. In isolation areas (which are analogous to shallow trench isolation regions in a planar device), fins are cut (removed) to provide isolation between N-type finFETs and P-type finFETs, or between devices having different working voltages. In other cases, finFET devices may utilize only a single fin. This is particularly used in cases where it is desirable to maximize circuit density, such as, for example, in an SRAM device. To prevent the fin merging between the various finFETs within an integrated circuit, various fins are removed, or "cut", to provide additional space between the various finFETs. One prior art method for fin removal is the "fin cut first" process, which is prone to edge effects, where the edge fins are prone to be wider than the center fins in the same structure, which can adversely affect device performance. Another approach is a fin cut last approach. One problem with prior art fin cut last techniques is that the fins that are adjacent to the ones that are to be removed are prone to being damaged during the fin removal process. This can happen due to various process factors, such as misalignment during the fin removal process.

Embodiments of the present invention provide protection for the fins that are to be kept, such that they are not damaged while removing the fins that are to be removed. A fin liner is applied to the fins. The fin liner is then removed from the fins that are to be removed. The fin liner is of a material that is selective compared to the semiconductor fins. Hence, the fins can be removed without significant damage to the fin liner. The subsets of fins that are to be removed are then removed, while the fin liner protects the adjacent fins (that are to be kept). In this way, product yield can be improved by preventing unwanted fin damage to the adjacent fins during the fin removal process.

A first aspect of the present invention includes a method of fabricating a semiconductor structure, comprising: forming a plurality of semiconductor fins disposed on a semiconductor substrate; depositing a fin liner on the plurality of semiconductor fins; removing the fin liner from a subset of semiconductor fins of the plurality of semiconductor fins; depositing a silicon-based gap fill material on the plurality of semiconductor fins; and removing the silicon-based gap fill material and the subset of semiconductor fins.

A second aspect of the present invention includes a method of fabricating a semiconductor structure, comprising: forming a plurality of semiconductor fins disposed on a semiconductor substrate; depositing a fin liner on the plurality of semiconductor fins; removing the fin liner from a subset of semiconductor fins of the plurality of semiconductor fins; depositing an organic gap fill material layer on the plurality of semiconductor fins; performing a partial recess of the organic gap fill material layer to expose an upper portion of the plurality of semiconductor fins; removing the subset of semiconductor fins; and removing the organic gap fill material layer.

A third aspect of the present invention includes a method of fabricating a semiconductor structure, comprising: forming a plurality of semiconductor fins disposed on a semiconductor substrate; depositing a fin liner on the plurality of semiconductor fins; removing the fin liner from a subset of semiconductor fins of the plurality of semiconductor fins; and removing the subset of fins.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Features of this invention will be more readily understood from the following detailed description of the various aspects of the invention taken in conjunction with the accompanying drawings in which.

DETAILED DESCRIPTION

Figure 1:
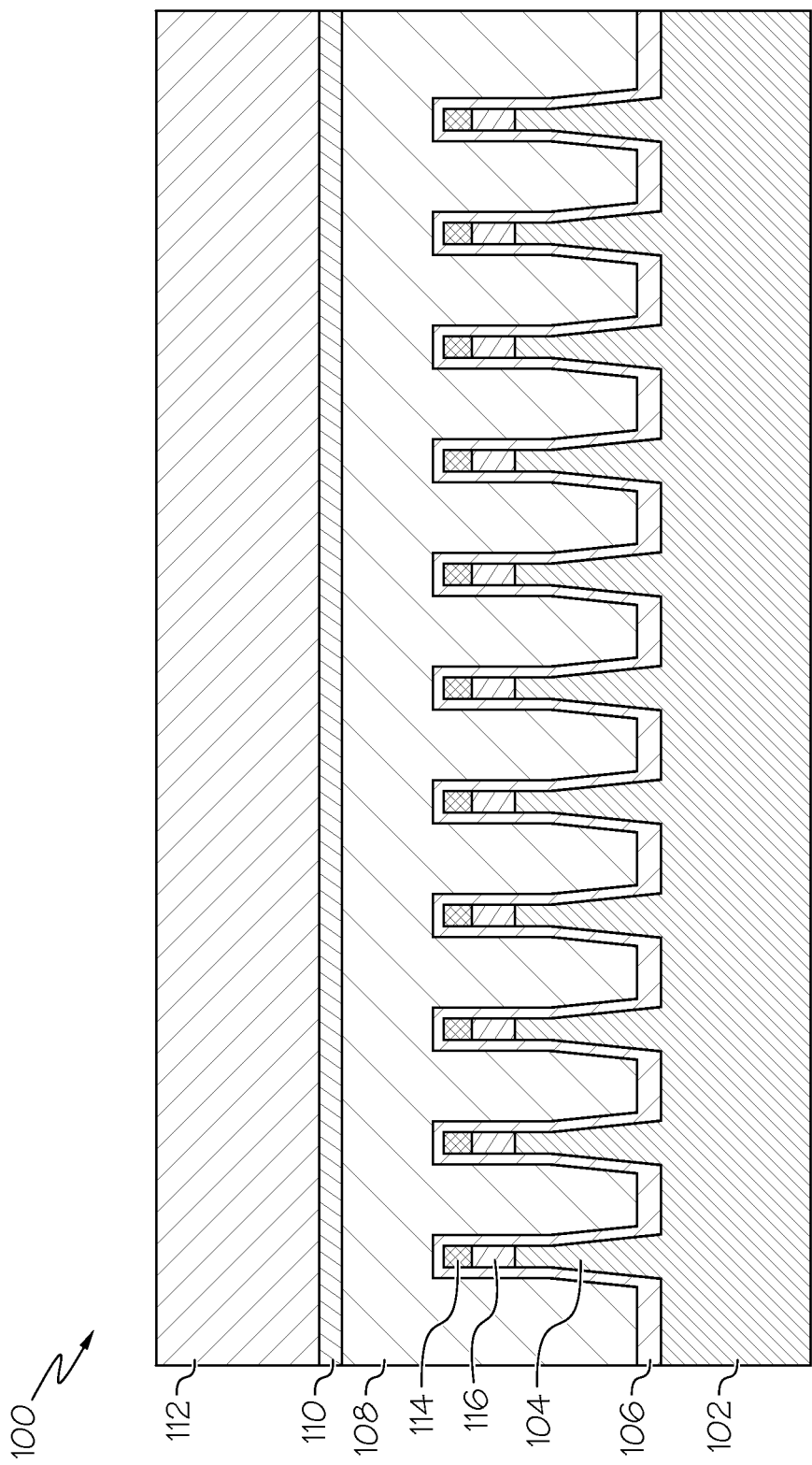
FIG. 1. is a semiconductor structure at a starting point for methods in accordance with illustrative embodiments.

Exemplary embodiments will now be described more fully herein with reference to the accompanying drawings, in which exemplary embodiments are shown. Exemplary embodiments of the invention provide protection for the fins that are to be kept, such that they are not damaged while removing the fins that are to be removed. A fin liner is applied to the fins. The fin liner is then removed from the fins that are to be removed. The fin liner is of a material that is selective compared to the semiconductor fins. Hence, the fins can be removed without significant damage to the fin liner. The subsets of fins that are to be removed are then removed, while the fin liner protects the adjacent fins (that are to be kept). In this way, product yield can be improved by preventing unwanted fin damage to the adjacent fins during the fin removal process.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

FIG. 1 shows a semiconductor structure 100 at a starting point for methods in accordance with illustrative embodiments. A semiconductor substrate 102 serves as the base of the structure 100. Substrate 102 may be made of silicon. A plurality of fins 104 are formed on substrate 102. The fins 104 may be formed by various methods known in the industry, utilizing patterning and etching techniques. One or more pad layers may be present on the tops of the fins 104. The pad layers may be blanket deposited on the substrate 102 prior to formation of the fins 104, serving as a hard mask. In one embodiment, a nitride layer 116 is disposed on top of the fins 104, and an oxide layer 114 is disposed on top of the nitride layer 116. The oxide layer 114 may be deposited via atomic layer deposition (ALD).

A fin liner 106 is deposited on, and in direct physical contact with, the fins 104. The fin liner 106 may be a conformal liner. In some embodiments, the fin liner 106 is made of an enhanced high aspect ratio process (eHARP) oxide, and may be deposited by chemical vapor deposition (CVD). In other embodiments, the fin liner 106 may include oxide deposited via atomic layer deposition (ALD). In some embodiments, the thickness of fin liner 106 ranges from about 3 nanometers to about 50 nanometers.

A gap fill layer 108 is deposited over the fins 104, and fills the gaps between each fin. The gap fill layer material may be made of an organic material, and may be considered as an organic planarization layer (OPL). An antireflective coating layer 110 (such as SiARC) may be disposed on gap fill layer 108. A photoresist layer 112 is deposited on the structure 100.

Figure 2:
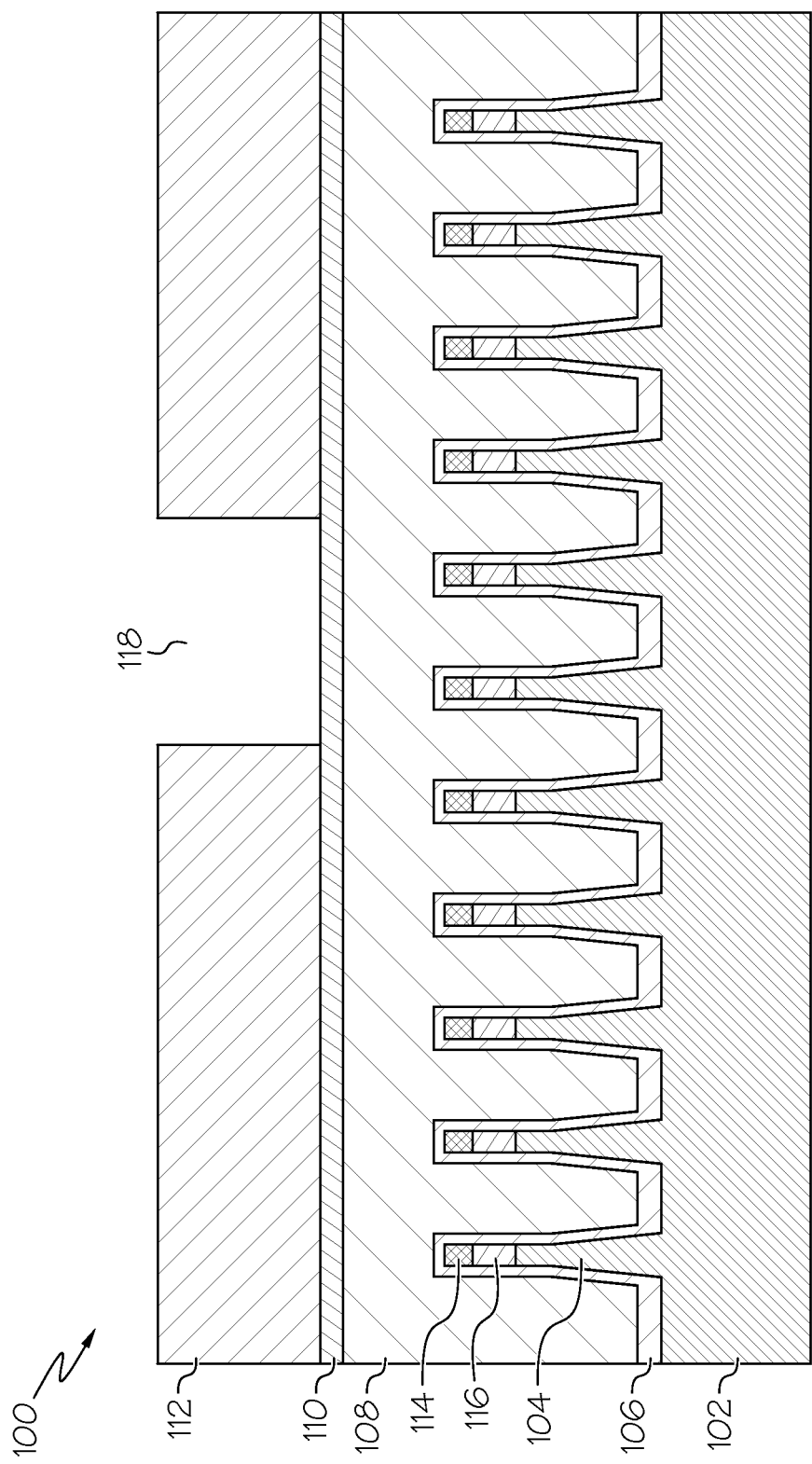
FIG. 2 is a semiconductor structure at a subsequent process step of patterning the photoresist.

FIG. 2 is semiconductor structure 100 at a subsequent process step of patterning the photoresist. Using lithographic and patterning techniques, a gap 118 is formed in the photoresist over a subset of the fins 104 that are to be removed (cut).

Figure 3:
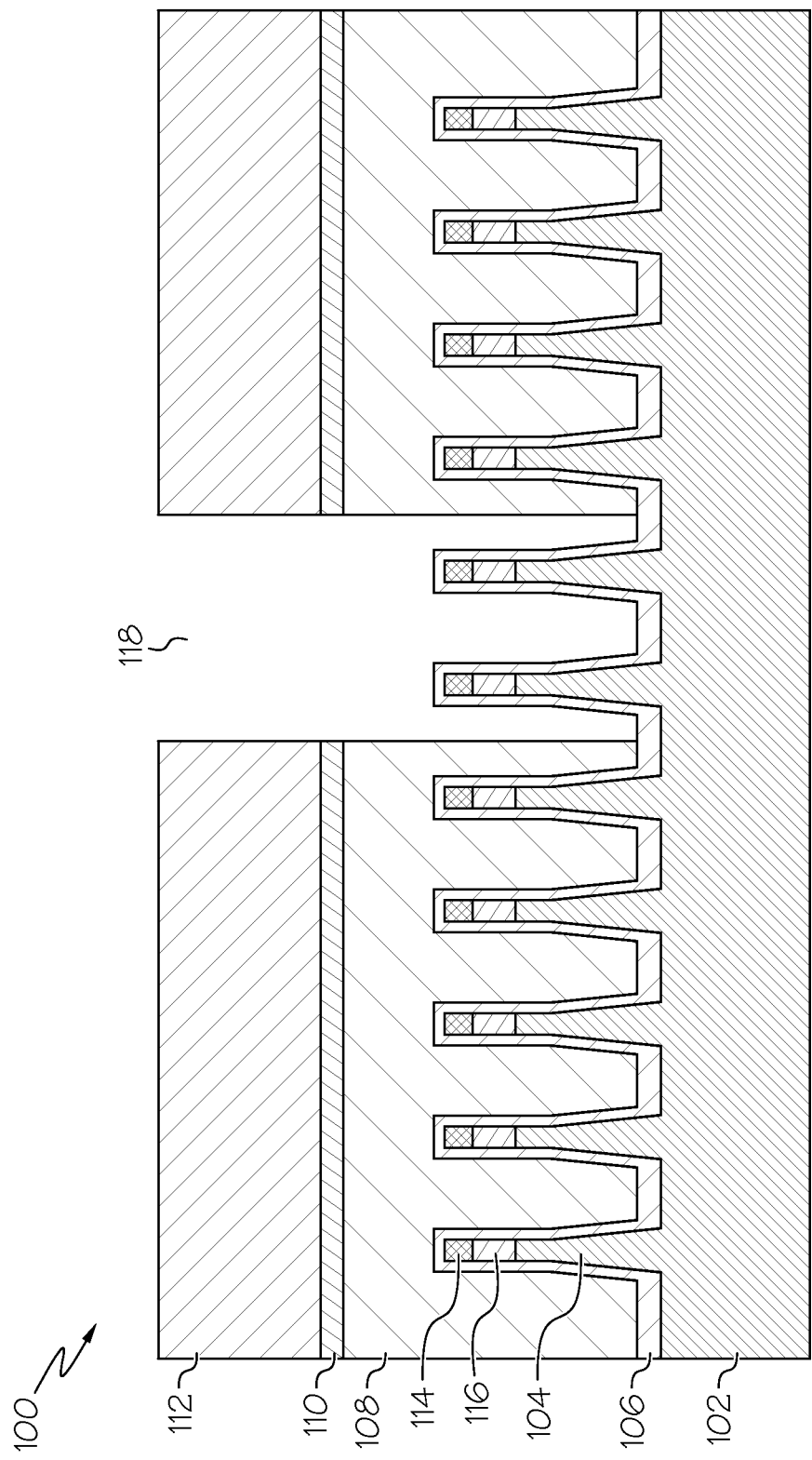
FIG. 3 is a semiconductor structure at a subsequent process step of exposing the subset of fins to be removed.

FIG. 3 is semiconductor structure 100 at a subsequent process step of exposing the subset of fins to be removed. The antireflective coating 110 and gap fill layer 108 are opened to expose a subset of the fins that are to be removed. The gap fill layer 108, being organic, has good selectivity to the fin liner 106. Hence, a selective etch process is used to open the gap fill layer that does not significantly etch the fin liner 106. In some embodiments, gap fill layer 108 and antireflective coating 110 may be consumed during a single etch process, depending on factors such as layer thickness and selectivity of the etch recipe.

Figure 4:
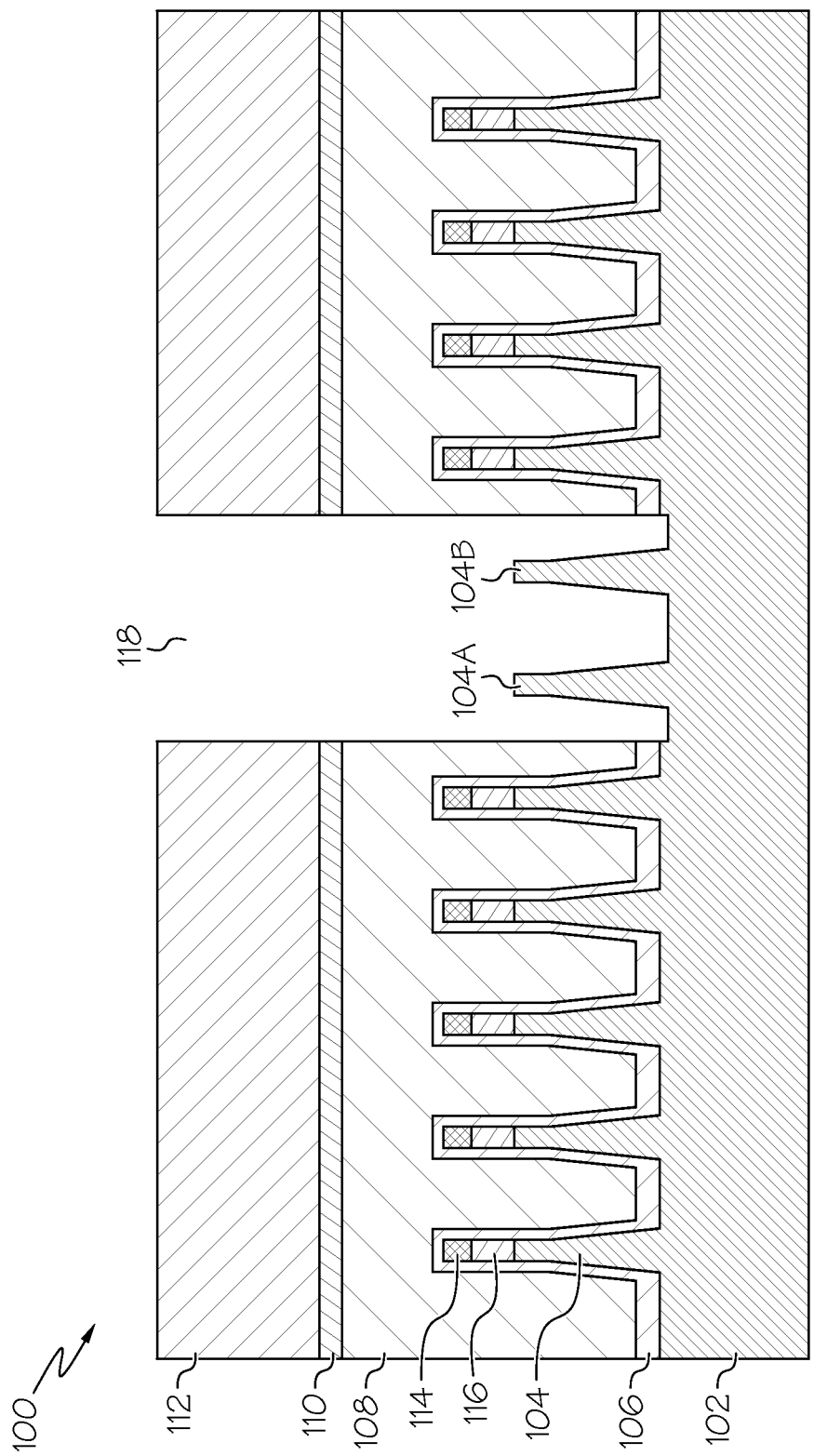
FIG. 4 is a semiconductor structure at a subsequent process step of removing the fin liner from the subset of fins to be removed.

FIG. 4 is semiconductor structure 100 at a subsequent process step of removing the fin liner 106 from the subset of fins to be removed (indicated as fin 104A and fin 104B). The pad layers (nitride and/or oxide) are also removed from the subset of fins to be removed (see 114 and 116 of FIG. 1).

Figure 5:
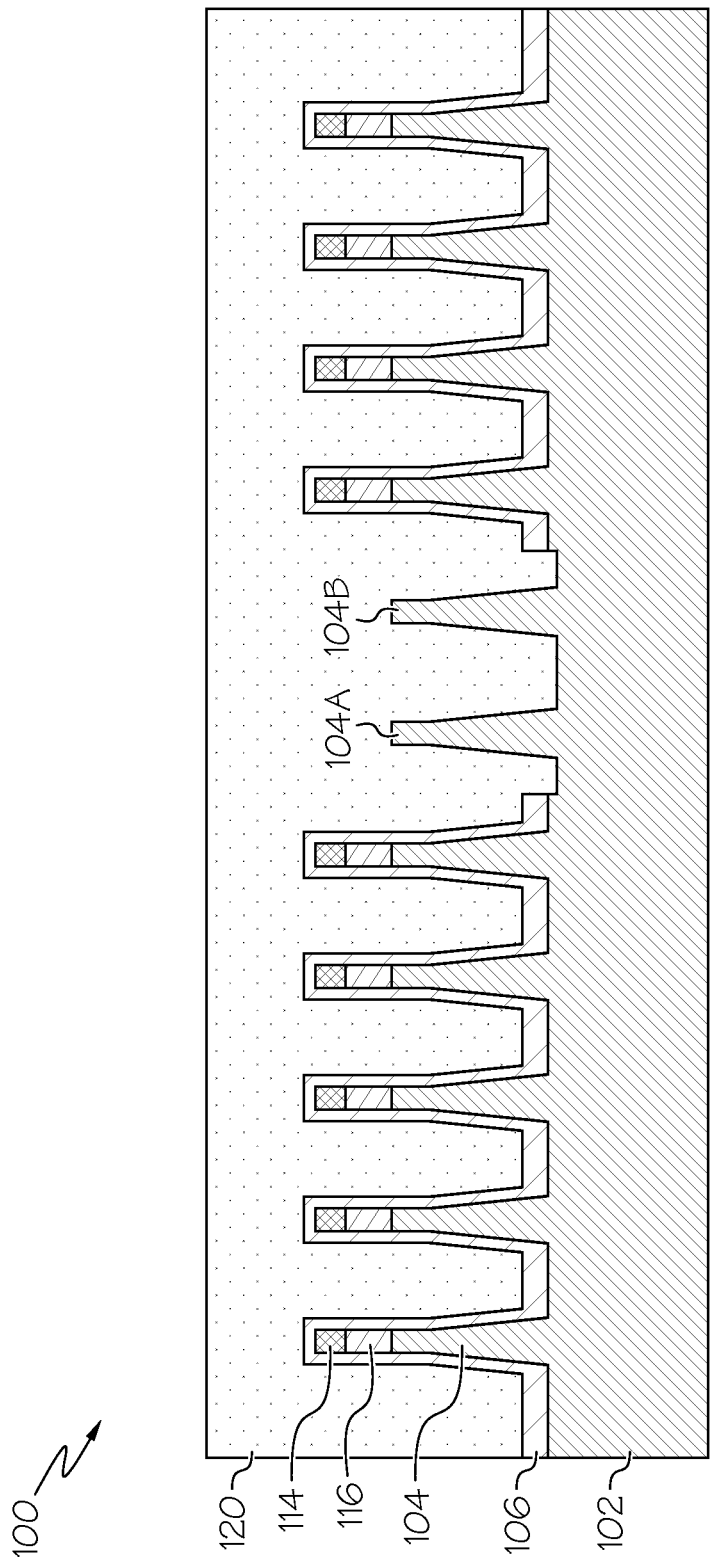
FIG. 5 is a semiconductor structure at a subsequent process step for a first embodiment, of depositing a silicon-based gap fill material.

FIG. 5 is semiconductor structure 100 at a subsequent process step for a first embodiment of depositing a silicon-based gap fill material 120. Following from FIG. 4, the first gap fill layer 108, antireflective coating 110, and photoresist 112 are completely removed. A silicon-based gap fill material 120 is then deposited over the structure 100. The silicon-based gap fill material 120 may be made of a deep ultraviolet light absorbing oxide (DUO). The etch rate of the gap fill material may be close to, or equal to the etch rate of silicon. However, the selectivity of the etch is high compared with fin liner 106, such that the fins are removed with almost no effect on the fin liner 106.

Figure 6:
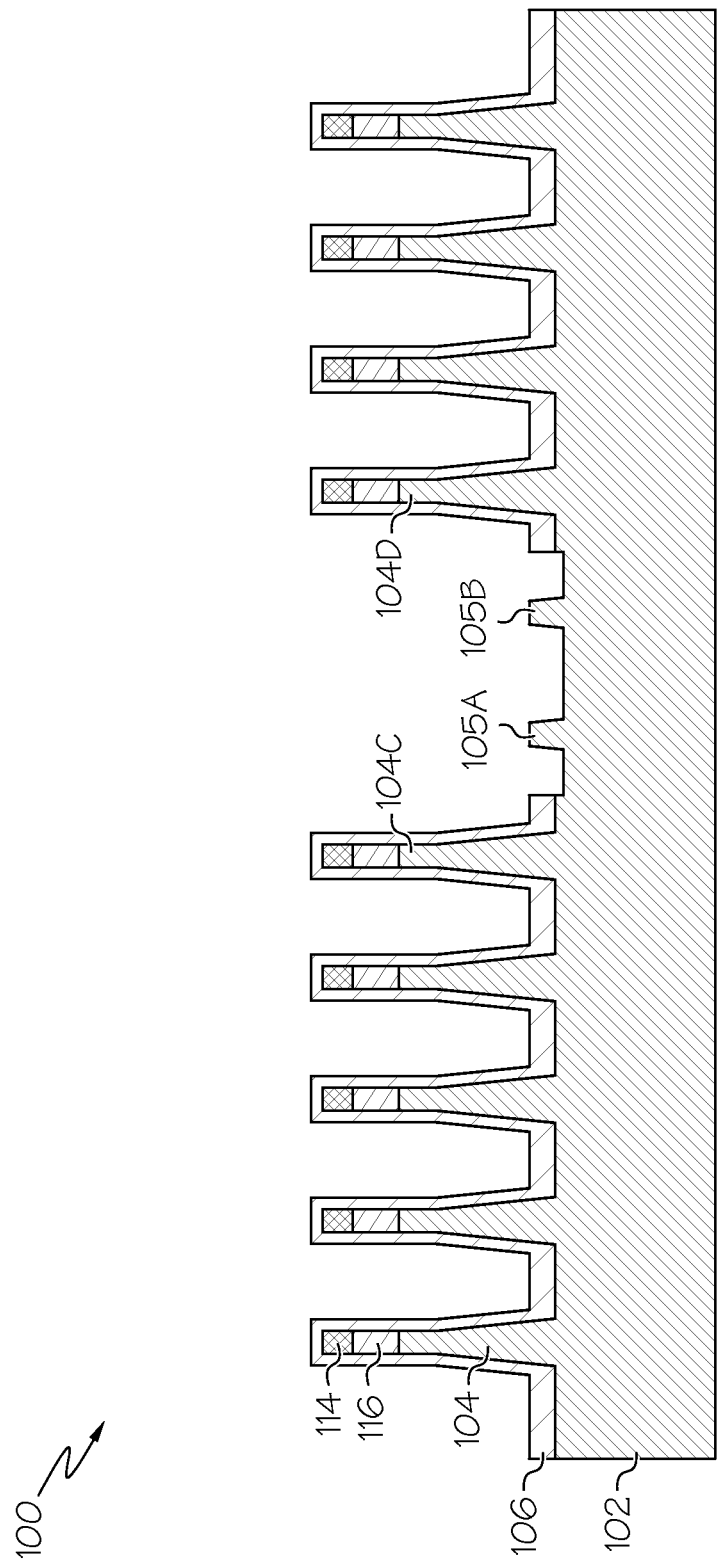
FIG. 6 is a semiconductor structure at a subsequent process step for a first embodiment, of removing the gap fill material and the subset of fins.

FIG. 6 is semiconductor structure 100 at a subsequent process step for a first embodiment of removing the gap fill material 120 and the subset of fins. Since the etch rate of the silicon-based gap fill material 120 is similar to that of silicon of the fins, the fins are mostly removed, leaving only small bumps 105A and 105B remaining. The other fins that are to be preserved continue to be protected by fin liner 106, and are not removed. In particular, the fins 104C and 104D, which are adjacent to the removed fins, are not adversely affected by the removal of fins 104A and 104B (see FIG. 5), since fins 104C and 104D are protected by fin liner 106.

Figure 7:
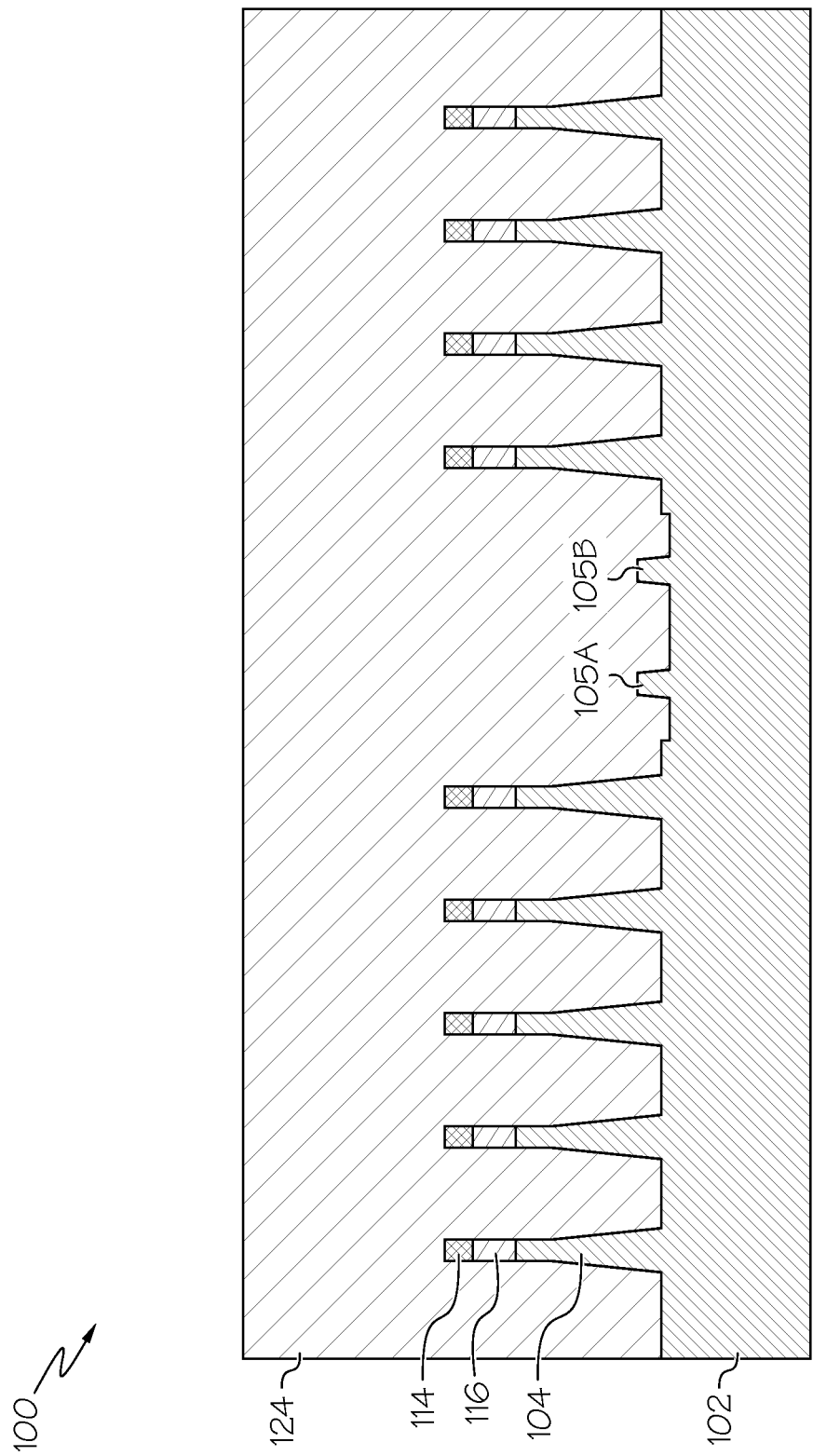
FIG. 7 is a semiconductor structure at a subsequent process step for a first embodiment, of depositing a second gap fill layer.

FIG. 7 is semiconductor structure 100 at a subsequent process step for a first embodiment of depositing a second gap fill layer 124, which may be made of the same material as fin liner 106 (see FIG. 1). From this point forward, known techniques in the industry may be used to complete the fabrication of the finFET devices. Subsequent processing steps may include fin merging, doping, gate formation, and contact formation.

Figure 8:
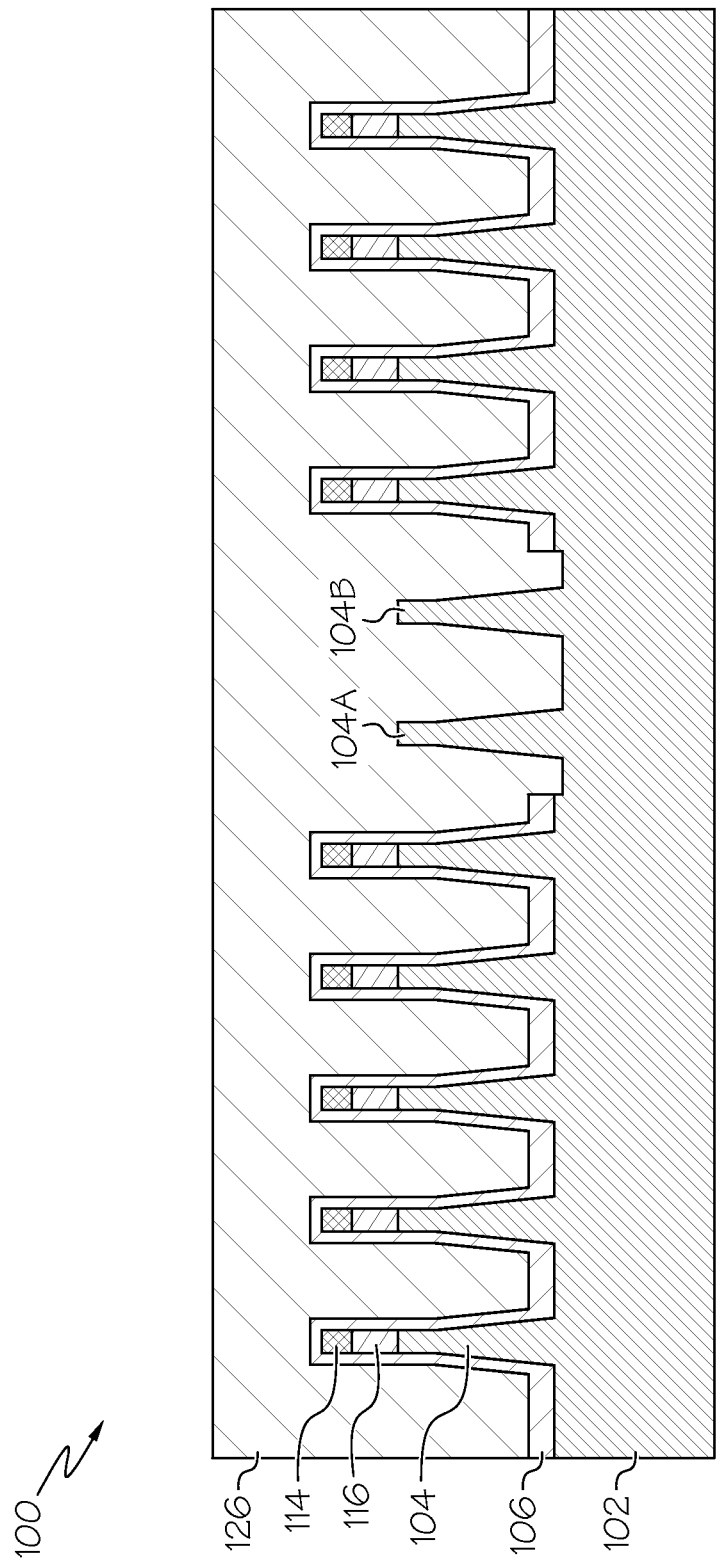
FIG. 8 is a semiconductor structure at a subsequent process step for a second embodiment, of depositing an organic gap fill material.

FIG. 8 is semiconductor structure 100 at a subsequent process step for a second embodiment of depositing an organic gap fill material layer 126. Following from FIG. 4, the first gap fill layer 108, antireflective coating 110, and photoresist 112 are completely removed. An organic gap fill material 126 is then deposited over the structure 100. In one embodiment, the organic gap fill material layer 126 may include amorphous carbon.

Figure 9:
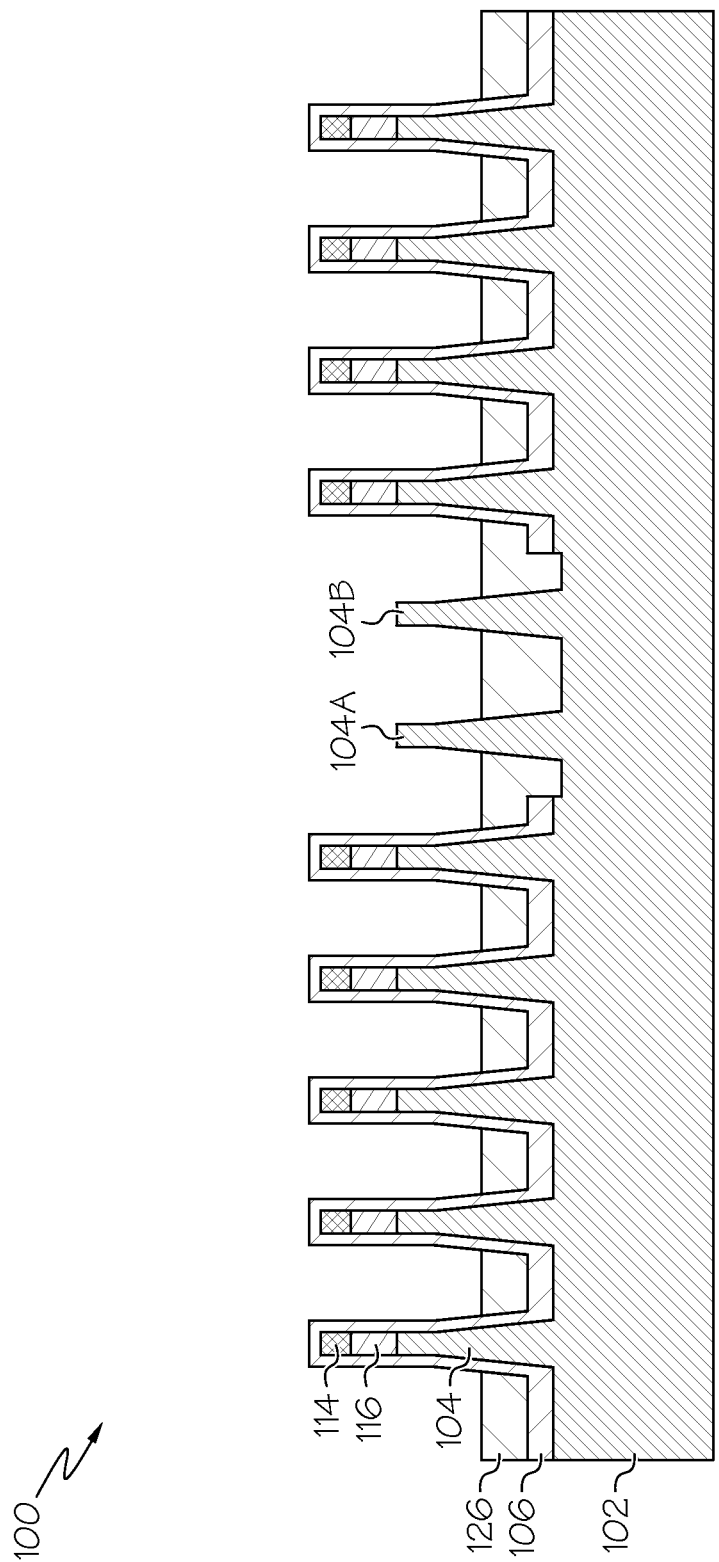
FIG. 9 is a semiconductor structure at a subsequent process step for a second embodiment, of partially recessing the organic gap fill material.

FIG. 9 is semiconductor structure 100 at a subsequent process step for a second embodiment, following from FIG. 8, of performing a partial recess on the organic gap fill material layer 126 to expose an upper portion of the fins 104A and 104B. The organic gap fill material layer 126 is recessed using a selective etch process that does not substantially etch the silicon fins 104A and 104B. The organic gap fill material layer 126 is recessed to a depth X below the tops of the fins 104A and 104B. In some embodiments, the depth X ranges from about 80 nanometers to about 90 nanometers, with a 100 nanometer trench depth. In general, the depth X depends on factors such as trench depth, and liner thickness.

Figure 10:
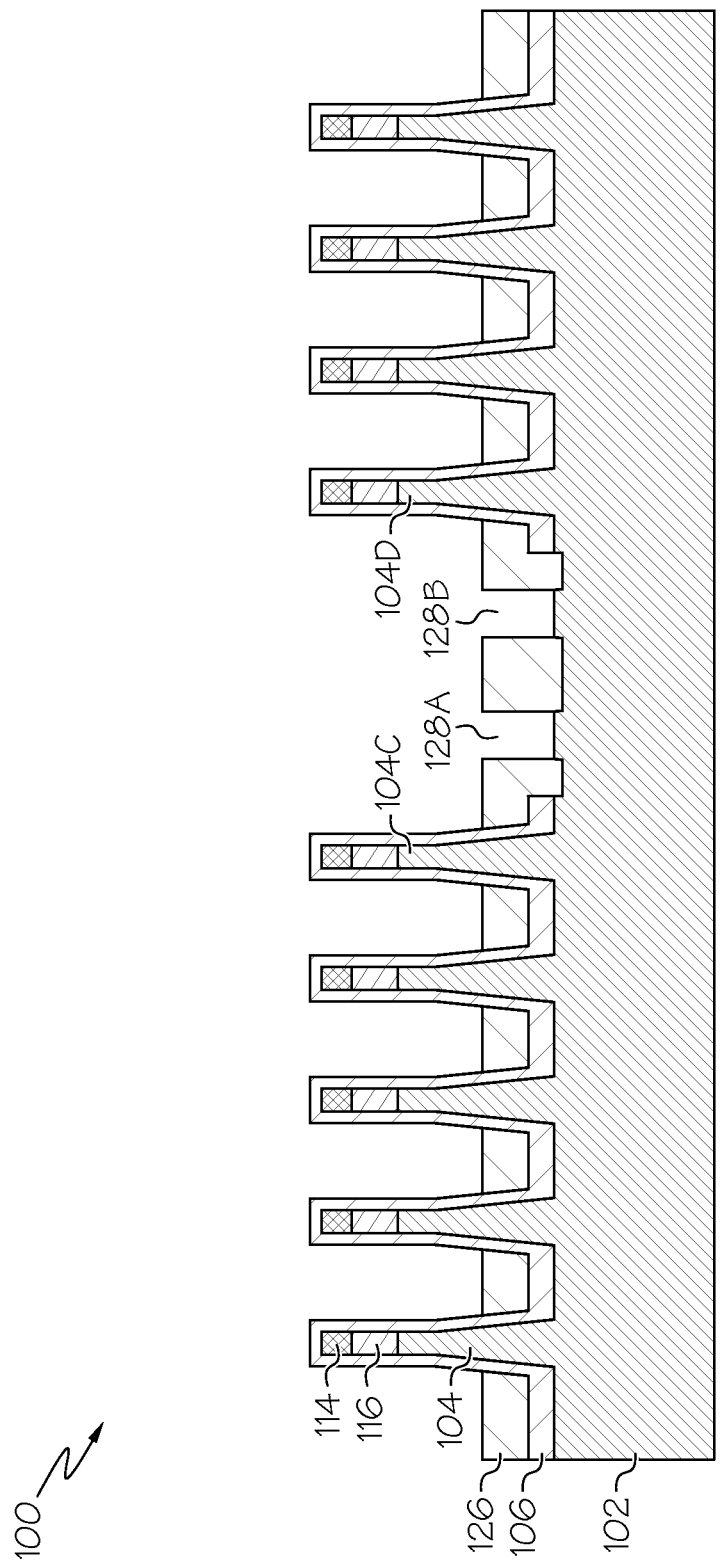
FIG. 10 is a semiconductor structure at a subsequent process step for a second embodiment, of removing the subset of fins.

FIG. 10 is semiconductor structure 100 at a subsequent process step for a second embodiment, following from FIG. 9, of removing the subset of fins. The fins may be removed with an anisotropic etch process. In some embodiments, a reactive ion etch (RIE) process is used to remove the fins. The RIE process is selective such that it does not remove the organic gap fill material layer 126. As a result, voids 128A and 128B are formed in the organic gap fill material layer 126 at the location where the removed fins were.

From this point forward, the remainder of the organic gap fill material layer 126 is removed using a selective etch process that does not substantially remove silicon material. The process then proceeds with another gap fill material made of the same material as the fin liner 106. The result is the semiconductor structure shown in FIG. 7. From this point forward, known techniques in the industry may be used to complete the fabrication of the finFET devices. Subsequent processing steps may include fin merging, doping, and contact formation. Fins 104C and 104D are adjacent to the removed fins. Fins 104C and 104D are protected by fin liner 106, and remain intact after the removal of fins 104A and 104B (see FIG. 9).

Figure 11:
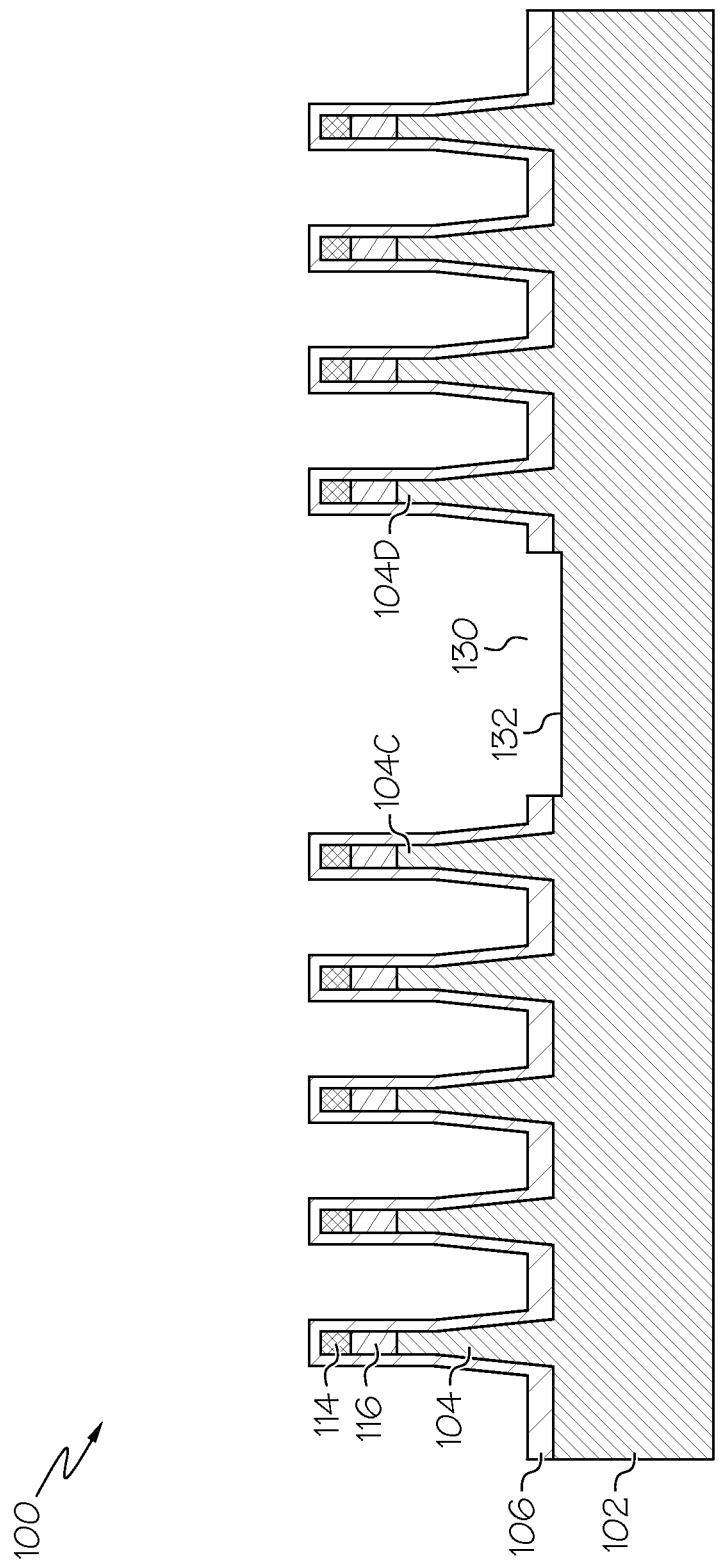
FIG. 11 is a semiconductor structure at a subsequent process step for a third embodiment, of removing the subset of fins with an isotropic etch process.

FIG. 11 is semiconductor structure 100 at a subsequent process step for a third embodiment of removing the subset of fins with an isotropic etch process. Following from FIG. 4, the first gap fill layer 108, antireflective coating 110, and photoresist 112 are completely removed. Fins 104A and 104B (see FIG. 4) are then removed with an isotropic etch process. In some embodiments, a wet etch is used to remove fins 104A and 104B. In some embodiments, an etchant of hydrofluoric acid is used. In some embodiments, an etchant of tetramethylammonium hydroxide (TMAH) is used. The result is a recessed region 130 of the substrate and a fairly smooth top surface 132 where the fins were removed. Fins 104C and 104D are adjacent to the removed fins. Fins 104C and 104D are protected by fin liner 106, and remain intact after the removal of fins 104A and 104B (see FIG. 4).

Figure 12:
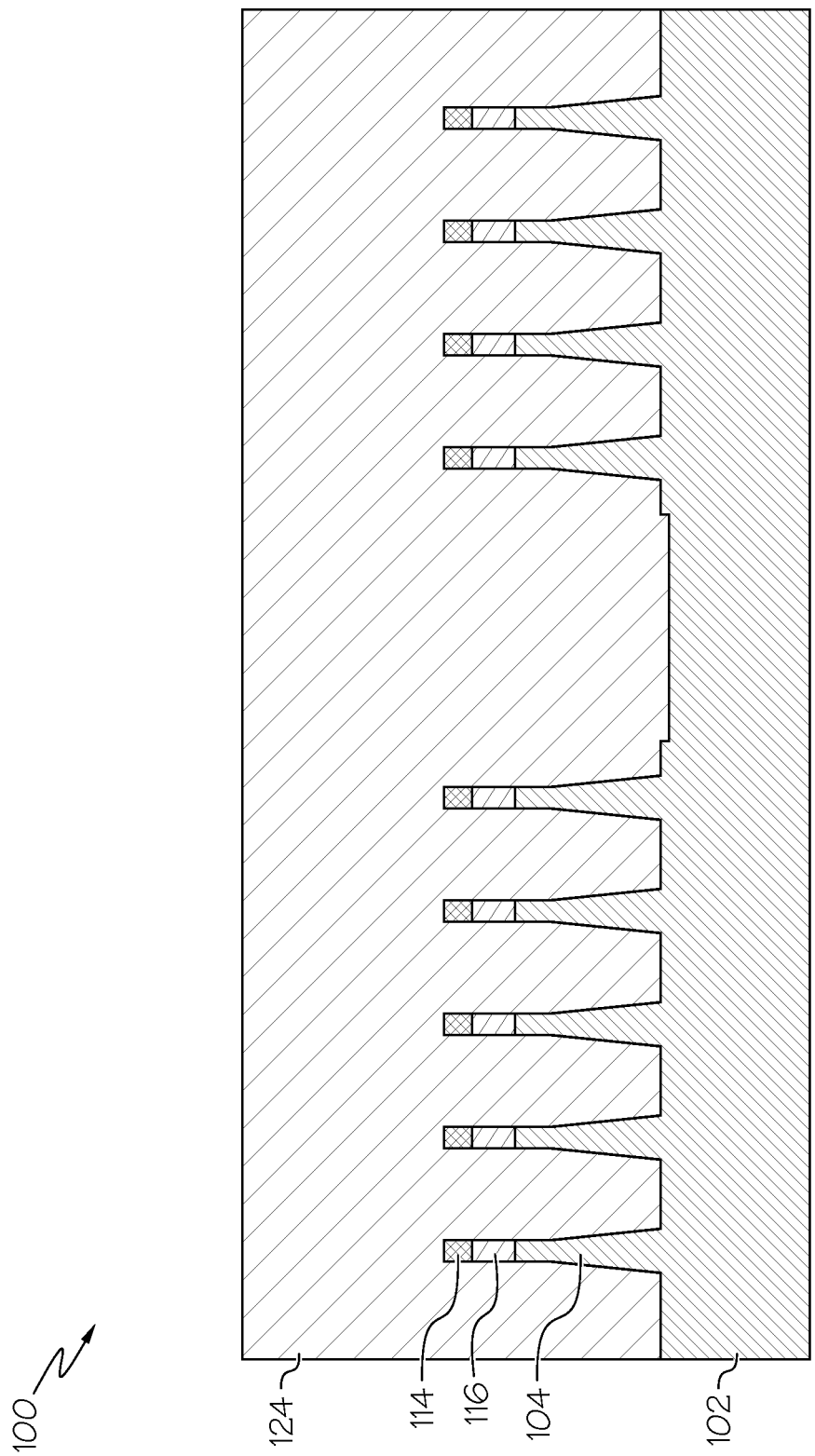
FIG. 12 is a semiconductor structure at a subsequent process step for a third embodiment, of depositing a second gap fill layer.

FIG. 12 is semiconductor structure 100 at a subsequent process step for a third embodiment, following from FIG. 11, of depositing a second gap fill layer 124. Layer 124 may be made of the same material as fin liner 106 (see FIG. 1). From this point forward, known techniques in the industry may be used to complete the fabrication of the finFET devices. Subsequent processing steps may include fin merging, doping, gate formation, and contact formation.

Figure 13:
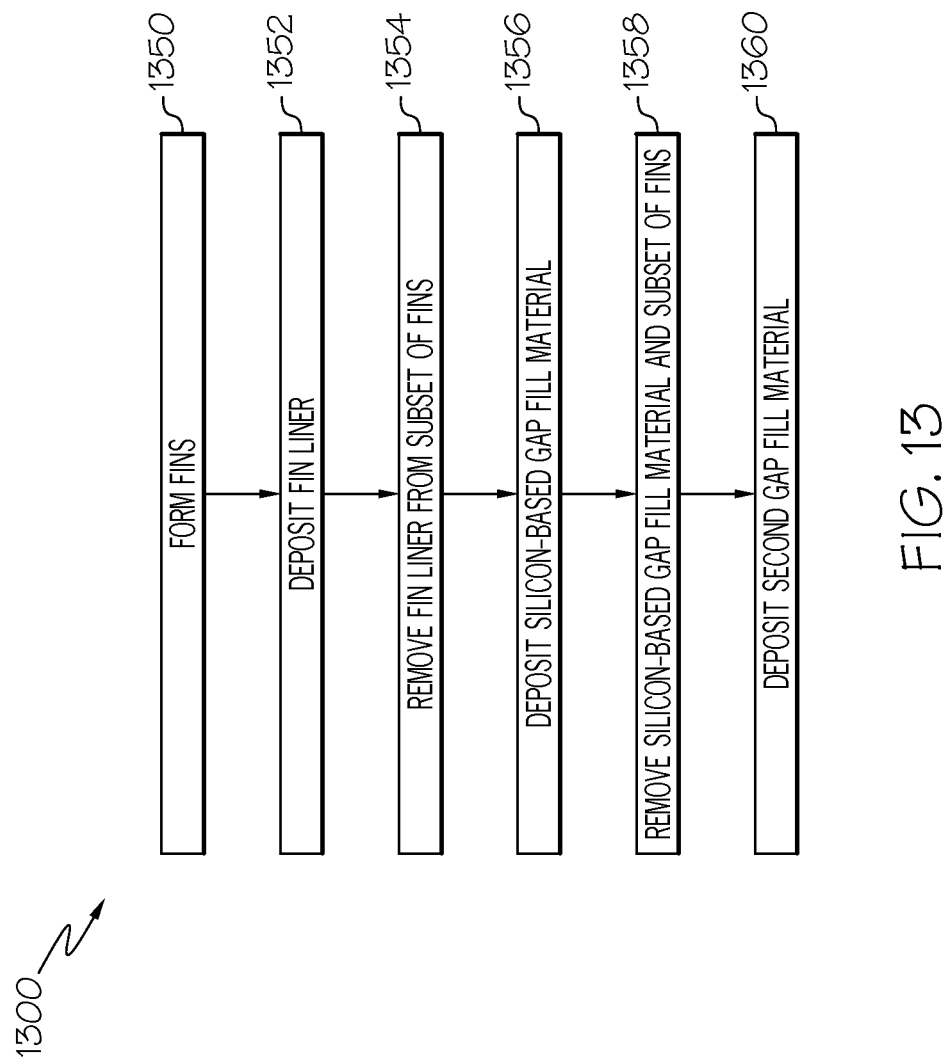
FIG. 13 is a flowchart showing process steps for a first embodiment of the present invention.

FIG. 13 is a flowchart 1300 showing process steps for a first embodiment of the present invention. In process step 1350, fins are formed in a substrate (see 104 of FIG. 1). In process step 1352, a fin liner is deposited over the fins (see 106 of FIG. 1). In process step 1354, the fin liner is removed from a subset of fins that are to be cut (removed) (see 104A and 104B of FIG. 4). In process step 1356, a silicon-based gap fill material is deposited over the fins (see 120 of FIG. 5). In process step 1358, the silicon-based gap fill material and subset of fins is removed (see FIG. 6). In process step 1360, a second gap fill material is deposited (see 124 of FIG. 7).

Figure 14:
FIG. 14 is a flowchart showing process steps for a second embodiment of the present invention.

FIG. 14 is a flowchart 1400 showing process steps for a second embodiment of the present invention. In process step 1450, fins are formed in a substrate (see 104 of FIG. 1). In process step 1452, a fin liner is deposited over the fins (see 106 of FIG. 1). In process step 1454, the fin liner is removed from a subset of fins that are to be cut (removed) (see 104A and 104B of FIG. 4). In process step 1456, an organic gap fill material is deposited over the fins (see 126 of FIG. 8). In process step 1458, the organic cap fill material is partially recessed (see FIG. 9). In process step 1460, a subset of fins are removed (see FIG. 10). In process step 1462, the remainder of organic gap fill material is removed. In process step 1464, a second gap fill material is deposited (see 124 of FIG. 7).

Figure 15:
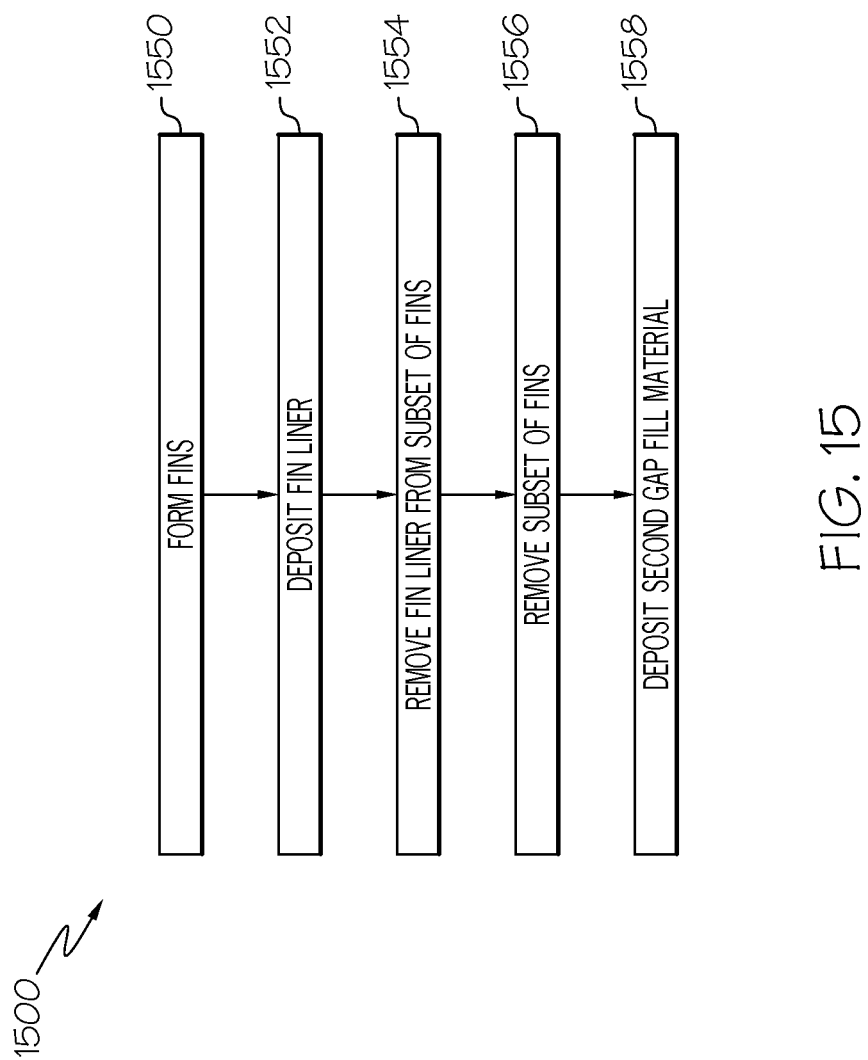
FIG. 15 is a flowchart showing process steps for a third embodiment of the present invention.

FIG. 15 is a flowchart 1500 showing process steps for a third embodiment of the present invention. In process step 1550, fins are formed in a substrate (see 104 of FIG. 1). In process step 1552, a fin liner is deposited over the fins (see 106 of FIG. 1). In process step 1554, the fin liner is removed from a subset of fins that are to be cut (removed) (see 104A and 104B of FIG. 4). In process step 1556, a subset of the fins are removed via an isotropic etch (see FIG. 11). In process step 1558, a second gap fill material is deposited (see 124 of FIG. 12).

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of fabricating a semiconductor structure, comprising:
    forming a plurality of semiconductor fins disposed on a semiconductor substrate;
    depositing a fin liner on the plurality of semiconductor fins;
    removing the fin liner from a subset of semiconductor fins of the plurality of semiconductor fins;
    depositing a silicon-based gap fill material on the plurality of semiconductor fins; and
    removing the silicon-based gap fill material and the subset of semiconductor fins.

2. The method of claim 1, wherein removing the silicon-based gap fill material and the subset of semiconductor fins is performed with an isotropic etch process.

3. The method of claim 2, wherein removing the silicon-based gap fill material and the subset of semiconductor fins is performed with a wet etch process.

4. The method of claim 2, wherein the isotropic etch process is performed using hydrofluoric acid.

5. The method of claim 2, wherein the isotropic etch process is performed using tetramethylammonium hydroxide.

6. The method of claim 1, wherein depositing a fin liner comprises depositing an enhanced high aspect ratio process (eHARP) oxide.

7. The method of claim 1, wherein depositing a fin liner comprises depositing silicon oxide via atomic layer deposition.

8. The method of claim 1, further comprising depositing a second gap fill material comprised of the same material as the fin liner.

9. A method of fabricating a semiconductor structure, comprising:
    forming a plurality of semiconductor fins disposed on a semiconductor substrate;
    depositing a fin liner on the plurality of semiconductor fins;
    removing the fin liner from a subset of semiconductor fins of the plurality of semiconductor fins;
    depositing an organic gap fill material layer on the plurality of semiconductor fins;
    performing a partial recess of the organic gap fill material layer to expose an upper portion of the plurality of semiconductor fins;
    removing the subset of semiconductor fins; and
    removing the organic gap fill material layer.

10. The method of claim 9, wherein depositing a fin liner comprises depositing an enhanced high aspect ratio process (eHARP) oxide.

11. The method of claim 9, wherein depositing a fin liner comprises depositing silicon oxide via atomic layer deposition.

12. The method of claim 9, wherein removing the subset of semiconductor fins is performed with an anisotropic etch process.

13. The method of claim 12, wherein the removing the subset of semiconductor fins is performed with a reactive ion etch process.

14. A method of fabricating a semiconductor structure, comprising:
    forming a plurality of semiconductor fins disposed on a semiconductor substrate;
    depositing a fin liner on the plurality of semiconductor fins;
    removing the fin liner from a subset of semiconductor fins of the plurality of semiconductor fins; and
    removing the subset of semiconductor fins.

15. The method of claim 14, wherein depositing a fin liner comprises depositing an enhanced high aspect ratio process (eHARP) oxide.

16. The method of claim 14, wherein depositing a fin liner comprises depositing silicon oxide via atomic layer deposition.

17. The method of claim 14, wherein removing the subset of semiconductor fins is performed with an isotropic etch process.

18. The method of claim 17, wherein removing the subset of semiconductor fins is performed with a wet etch.

19. The method of claim 17, wherein the isotropic etch process is performed using hydrofluoric acid.

20. The method of claim 17, wherein the isotropic etch process is performed using tetramethylammonium hydroxide.

* * * * *